United States Patent [19]
Kim

[11] Patent Number: 5,978,229
[45] Date of Patent: Nov. 2, 1999

[54] CIRCUIT BOARD

[75] Inventor: Ji-Sang Kim, Kyungki-do, Rep. of Korea

[73] Assignee: Samsung Electronics Co., Ltd., Kyungki-do, Rep. of Korea

[21] Appl. No.: 08/986,691

[22] Filed: Dec. 8, 1997

[30] Foreign Application Priority Data

Dec. 7, 1996 [KR] Rep. of Korea ...................... 96-62852

[51] Int. Cl.$^6$ ...................................................... H05K 1/11
[52] U.S. Cl. ........................... 361/760; 361/764; 361/765; 361/807; 361/784; 361/785; 257/737; 257/738; 257/780; 257/782; 257/696; 257/697; 439/74; 439/75; 174/52.4; 174/260; 174/261; 174/262; 174/263
[58] Field of Search ...................................... 361/760, 764, 361/765, 767, 772, 777, 778, 783, 801, 803, 807, 808, 820, 728, 736, 741, 784, 785, 291; 257/734, 737, 738, 780, 782, 784, 773, 774, 696, 697; 439/65, 74, 75; 174/52.4, 260–263

[56] References Cited

U.S. PATENT DOCUMENTS

| | | | |
|---|---|---|---|
| 4,054,901 | 10/1977 | Edwards | 357/81 |
| 4,663,695 | 5/1987 | Ohkawara et al. | 361/405 |
| 4,750,092 | 6/1988 | Werther | 361/783 |
| 4,969,827 | 11/1990 | Hahs, Jr. | 361/395 |
| 5,045,976 | 9/1991 | Guillemonot | 361/417 |
| 5,155,905 | 10/1992 | Miller, Jr. | 29/843 |
| 5,160,270 | 11/1992 | Reymond | 439/70 |
| 5,164,818 | 11/1992 | Blum et al. | 257/778 |
| 5,277,612 | 1/1994 | Windham et al. | 439/326 |
| 5,515,241 | 5/1996 | Werther | 361/784 |
| 5,555,488 | 9/1996 | McLellan et al. | 361/820 |
| 5,557,504 | 9/1996 | Siegal et al. | 361/173 |
| 5,671,125 | 9/1997 | Russell et al. | 361/760 |
| 5,680,057 | 10/1997 | Johnson | 324/757 |
| 5,684,675 | 11/1997 | Taniguchi et al. | 361/704 |
| 5,743,009 | 4/1998 | Matsui et al. | 29/843 |
| 5,751,556 | 5/1998 | Butler et al. | 361/773 |
| 5,859,538 | 1/1999 | Self | 324/755 |

*Primary Examiner*—Leo P. Picard
*Assistant Examiner*—David Foster
*Attorney, Agent, or Firm*—Robert E. Bushnell, Esq.

[57] ABSTRACT

An apparatus and a process for precisely mounting integrated circuit packages on circuit boards. The package has guide pins on its bottom surface that mate with non standard holes on the circuit board. This simplifies the precise positioning of packages on circuit boards. When the package is properly mounted on the circuit board many leads on the bottom surface of the integrated circuit package are electrically connected with the circuit board.

18 Claims, 8 Drawing Sheets

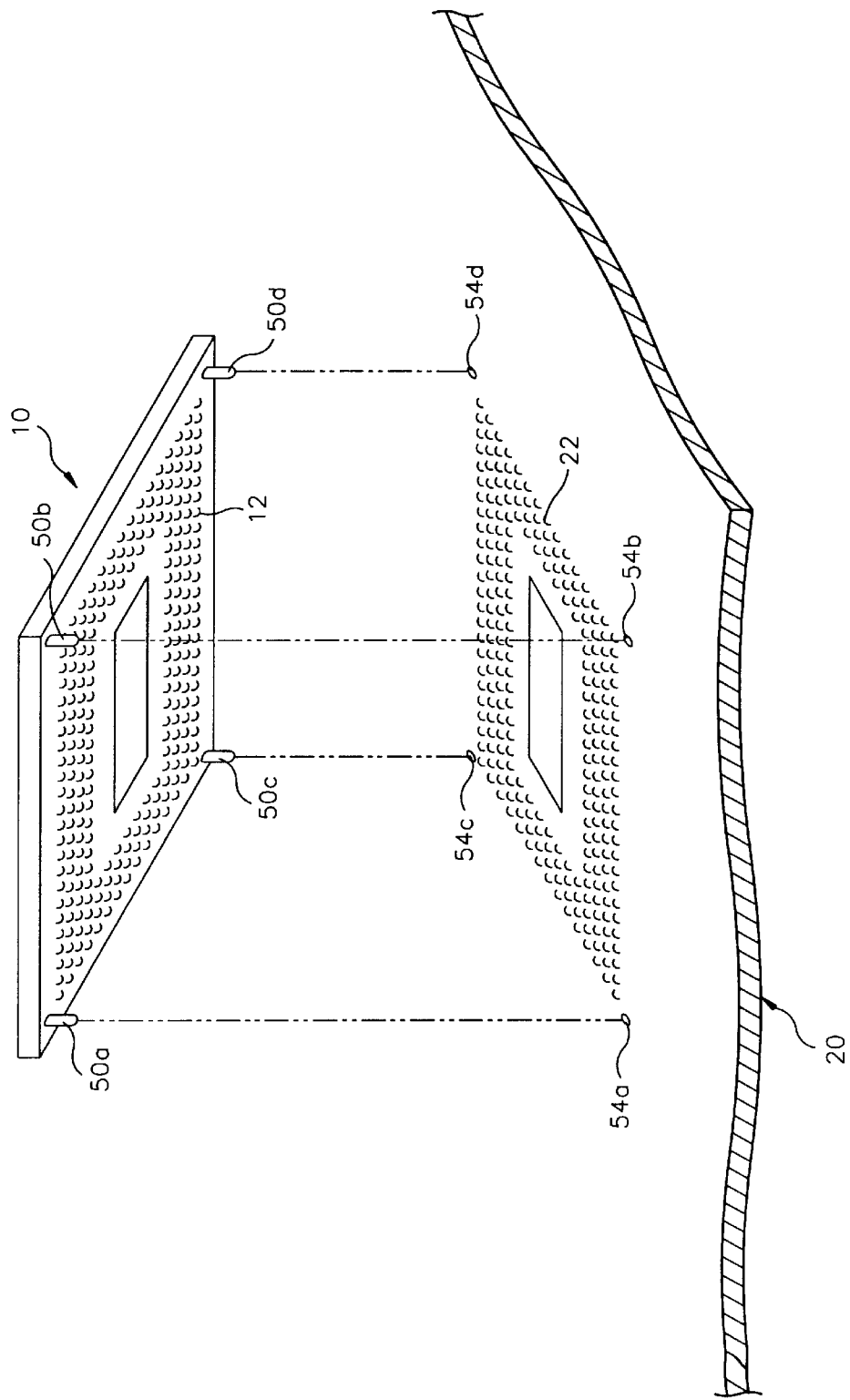

CIRCUIT BOARD

CLAIM OF PRIORITY

This application makes reference to, incorporates the same herein, and claims all rights accruing thereto under 35 U.S.C. §119 through my patent application entitled Integrated Circuit Board earlier filed in the Korean Industrial Property Office on the 7th day of December 1996 and there duly assigned Ser. No. 1996/62852.

BACKGROUND OF THE INVENTION

1. Field of the Invention

The present invention relates to an circuit board and, more particularly, to an circuit board that allows an integrated circuit package to be precisely and easily mounted.

2. Background Art

Recently, as the semiconductor technologies have developed, integrated circuits having complex functions have been introduced. As an example of such integration, the integration of a central processing unit (CPU) which performs very important functions of the microcomputer has progressed rapidly. In addition, to emit heat from the integrated circuit having complex functions, the shape of the package of the integrated circuit has been changed. For example, the CPU of a microcomputer has been developed from an 8086 8-bit processor to 80386, 80486, and 80586 32-bit processors through 80-286 16-bit processors. As CPUs having higher efficiencies have been developed, the number of the leads of the CPU rapidly increases. Moreover, as the density of the leads increases, new technologies for mounting the CPU on the printed circuit board have been developed.

In recent days, with high efficiency being required even in a small computer such as a notebook computer, a Pentium™ processor which functions as the CPU is mounted and will continue to be mounted in compliance with the requests of users. However, in the case of notebook computers, which require circuits that are further miniaturized, the use of small integrated circuits has become necessary. As the external size of integrated circuits becomes smaller, the shape of the package becomes more significant due to the heat that is generated. An integrated circuit of the TCP type is a very small compartment that includes 320 pins and has a spacing of 0.2 mm between the leads. As a result of the size of the integrated circuit package and the even smaller size of the printed circuit board, the exact mounting of integrated circuit devices has been an area of continuing research. Some techniques for mounting integrated circuit packages are shown, by way of example, in U.S. Pat. No. 4,663,695 to Ohkawara entitled Holding Device for Mounting an Electronic Component on a Printed Circuit Board, U.S. Pat. No. 5,045,976 to Guilleminot entitled Device for Mounting a Metal Element on a Board, U.S. Pat. No. 5,160,270 to Reymond entitled Integrated Circuit Packages Using Tapered Spring Contact Leads for Direct Mounting to Circuit Boards, U.S. Pat. No. 4,054,901 to Edwards entitled Index Mounting Unitary Heat Sink Apparatus with Apertured Base, U.S. Pat. No. 5,684,675 to Taniguchi entitled Semiconductor Device Unit Having Holder, U.S. Pat. No. 5,277,612 to Windham entitled Carrier for Guiding and Supporting Semiconductor Devices, U.S. Pat. No. 5,555,488 to McLellan entitled Integrated Circuit Device Having Improved Post for Surface-Mount Package, U.S. Pat. No. 5,557,504 to Siegel entitled Surface Mountable Integrated Circuit Package With Detachable Module, U.S. Pat. No. 5,671,125 to Russell entitled Vertical Package Mounted on Both Sides of a Printed Circuit Board, U.S. Pat. No. 5,155,905 to Miller, Jr. entitled Method and Apparatus for Attaching a Circuit Component to a Printed Circuit Board, U.S. Pat. No. 5,680,057 to Johnson entitled Integrated Circuit Testing Assembly and Method, U.S. Pat. No. 5,680,057 to Johnson entitled Integrated Circuit Testing Assembly and Method, and U.S. Pat. No. 4,969,827 to Hahs, Jr. entitled Modular Interconnecting Electronic Circuit Blocks.

Often integrated circuit packages are mounted on a ball grid array (BGA) that has lead pins located on the bottom' surface of the BGA. The integrated circuit package is then placed on a printed circuit board by a surface mount technology (SMT) handler. When the BGA package is held and moved by the programmed SMT handler to be mounted on a printed circuit board, the lead pins of the integrated circuit supporting BGA package must be exactly positioned on the printed circuit board. Failure of the lead pins to be exactly positioned on the pads leads to the poor mounting of integrated circuit packages.

I have noticed, however, that since the lead pins of the BGA package are too short, it is difficult to determine whether the BGA package is correctly mounted on the printed circuit board. As the SMT handler moves during the package mounting operation, any deviation from the proper position of the SMT handler leads to the incorrect positioning of the integrated circuit package on the printed circuit board. I have further noticed that it is often difficult to determine whether the integrated circuit package is correctly mounted on the printed circuit board. I expect that an circuit board that made it easier to precisely position an integrated package would improve the efficiency of production

SUMMARY OF THE INVENTION

Accordingly it is an object of the present invention to provide an improved printed circuit board.

It is another object to provide an integrated circuit package that can be more easily and precisely positioned on a printed circuit board.

It is still another object to provide a printed circuit board and an integrated circuit package that increase the efficiency of production of electrical systems.

It is yet another object to provide an integrated circuit package

To achieve these and other objects, an integrated circuit (IC) is provided that has an integrated circuit package mounted on itself that may be constructed with at least two guide pins. These pins are located on a bottom surface of the integrated circuit package and correspond to pin receiving holes located on the circuit board. The pins on the bottom of the integrated circuit package are of a different size or shape than the normal pin size of the circuit board so that it is easy to determine when the integrated circuit is precisely placed on the circuit board.

In accordance with a second embodiment of the present invention, there is provided an circuit board having an integrated circuit package that is covered by an assembly housing which completely encloses and secures the integrated circuit package. The position of the integrated circuit package is precisely determined by the placement of the special pins of the assembly housing into customized holes in the printed circuit board. There are at least two guide pins on the housing module that are inserted into the circuit board. The pins attached to the housing module are preferably of a non-standard size or shape to make it easy to precisely position the integrated circuitry on the circuit board.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 3A is a perspective view diagram illustrating the various directions that the surface mount technology handler can maneuver in;

FIG. 3B is a top view diagram illustrating the various directions that the surface mount technology handler can maneuver in;

FIG. 4 is an exploded perspective view of an circuit board and integrated circuit package an constructed in accordance with the principles of the present invention showing the integrated circuit package before it is completely mounted on a printed circuit board;

DETAILED DESCRIPTION OF THE PREFERRED EMBODIMENTS

Figure 1A:
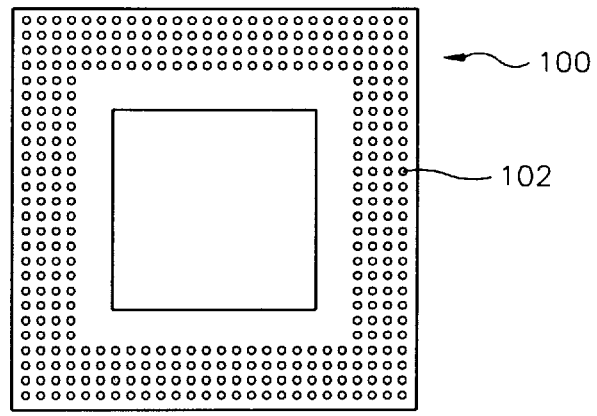
FIG. 1A is a bottom view of an integrated circuit package.
Figure 1B:
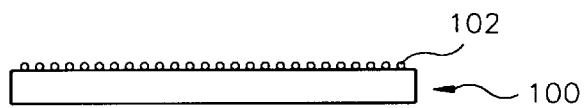
FIG. 1B is a side view of the integrated circuit package shown in FIG. 1A.
Figure 2:
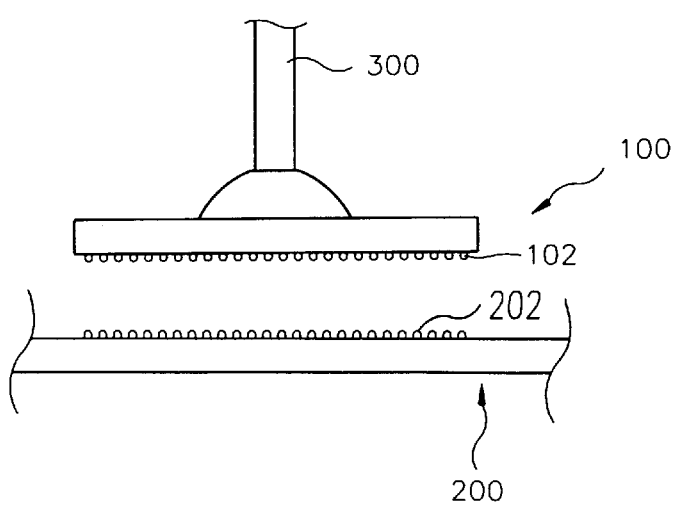
FIG. 2 is a side view of the integrated circuit package of FIG. 1A being mounted on a printed circuit board by a surface mount technology handler.

Turning now to the drawings, FIGS. 1A and 1B illustrate ball grid array (BGA) package 100 that has lead pins 102 positioned on the bottom surface of the BGA. FIG. 2 is a diagram showing the mounting process for a ball grid array package. Surface mount technology (SMT) handler 300 is positioning BGA package 100 over circuit board 200 to bring lead pins 102 of the BGA package into appropriate contact with pads 202 of the circuit board. As shown in FIG. 2, when BGA package 100 is held and moved by the programed SMT handler 300 to be mounted on printed circuit board 200, the lead pins 102 of the BGA package 100 must be exactly positioned corresponding to pads 202 which are located on the upper surface of printed circuit board 200. Failure to correctly align the lead pins to the pads leads to the poor mounting of integrated circuit packages onto the printed circuit board. The shortness of lead pins 102 of BGA package 100 makes it especially difficult to determine whether BGA package 100 is precisely mounted on printed circuit board 200.

Figure 3A:
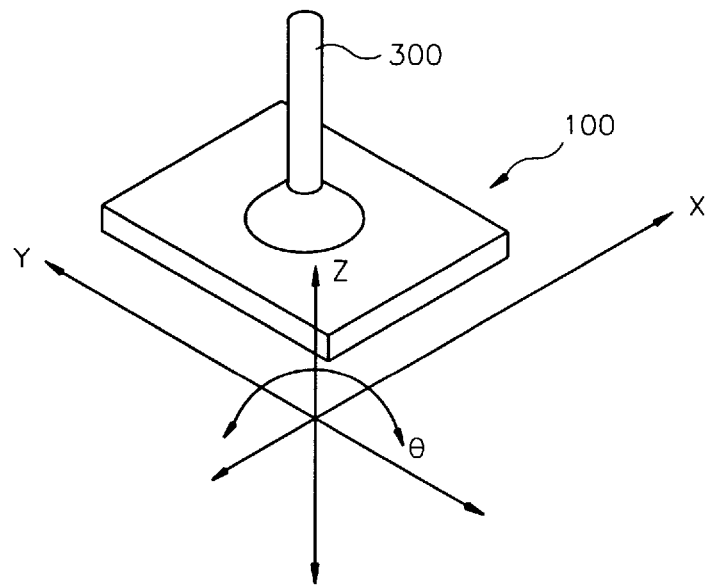
Figure 3B:
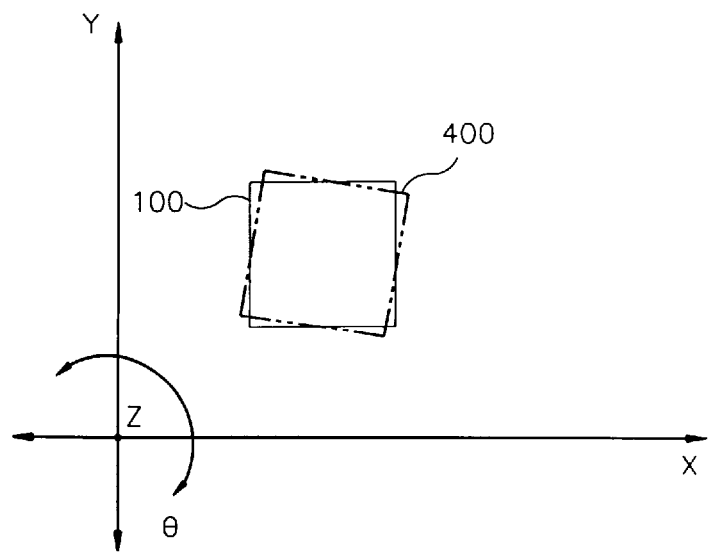

Moreover, as shown in FIGS. 3A and 3B, SMT handler 300 can be moved along in any one of three linear direction or rotated around one axis of rotation. This gives the SMT handler four position variables through which movement is possible, for example, x-axis, y-axis, z-axis and rotation angle θ, indicative of horizontal and vertical directions and rotation. As SMT handler 300 is is moved along a moving rail, an integrated circuit package held by the handler is moved in a preset direction to be mounted on printed circuit board 200. At this point, any deviation in the moving rail guiding the SMT handler will result in the incorrect positioning of the integrated circuit package on the printed circuit board, as indicated by reference numeral 400 of FIG. 3B.

FIG. 4 shows an circuit board as constructed according to a first embodiment of the present invention. Integrated circuit package 10 is not completely mounted on printed circuit board 20. The integrated circuit board according to the invention is broadly classified into two main parts, integrated circuit package 10 and printed circuit board 20. Integrated circuit package 10 has, for example, four guide pins 50a, 50b, 50c and 50d that are positioned at four edge portions along the bottom surface of integrated circuit package 10. Printed circuit board 20 has four matching holes 54a, 54b, 54c and 54d that are tailored to snugly fit around guide pins 50a through 50d, respectively. In this embodiment, the integrated circuit board is provided with four guide pins, but the integrated circuit board use as few as two guide pins.

Also, a number of leads 12 are provided on the bottom surface of integrated circuit package 10 and a number of pads 22 are provided on the upper surface of the printed circuit board 20. If integrated circuit package 10 is completely mounted on the printed circuit board 20 with guide pins 50a through 50d snugly fit inside of holes 54a through 54d, then leads 12 of the integrated circuit package are electrically connected with pads 22 of the printed circuit board, respectively. Holes 54a through 54d are precisely positioned to receive guide pins 50a through 50d, respectively. Guide pins 12 and holes 22 of the integrated circuit board allow the integrated circuit package 10 to be easily and exactly mounted on the printed circuit board 20. Although not shown in FIG. 4, the integrated circuit package 10 has an integrated circuit chip placed upon the integrated circuit package.

Figure 5:
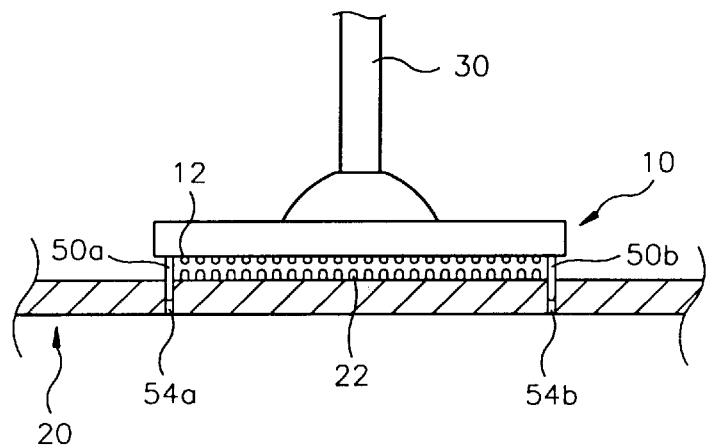
FIG. 5 is a cross-sectional side view of the integrated circuit board and package of FIG. 4 showing the integrated circuit package when the package is nearly completely mounted on the printed circuit board by a surface mount technology handler.

A SMT handler is shown in FIG. 5 as it is about to complete the mounting of integrated circuit package 10 onto printed circuit board 20. SMT handler 30 is an apparatus for holding and moving integrated circuit package 10 toward printed circuit board 20 to mount the integrated circuit package onto the printed circuit board. As shown in FIG. 5, guide pins 50a through 50d are inserted into holes 54a through 54d, respectively. Thus, integrated circuit package 10 is precisely mounted onto the printed circuit board. Leads 12 of the integrated circuit package are also connected with pads 22, respectively. When performing process of mounting integrated circuit package 10 onto printed circuit board 20 using the SMT handler, an operator can easily determine whether the integrated circuit package is precisely positioned and mounted onto the printed circuit board.

Figure 7:
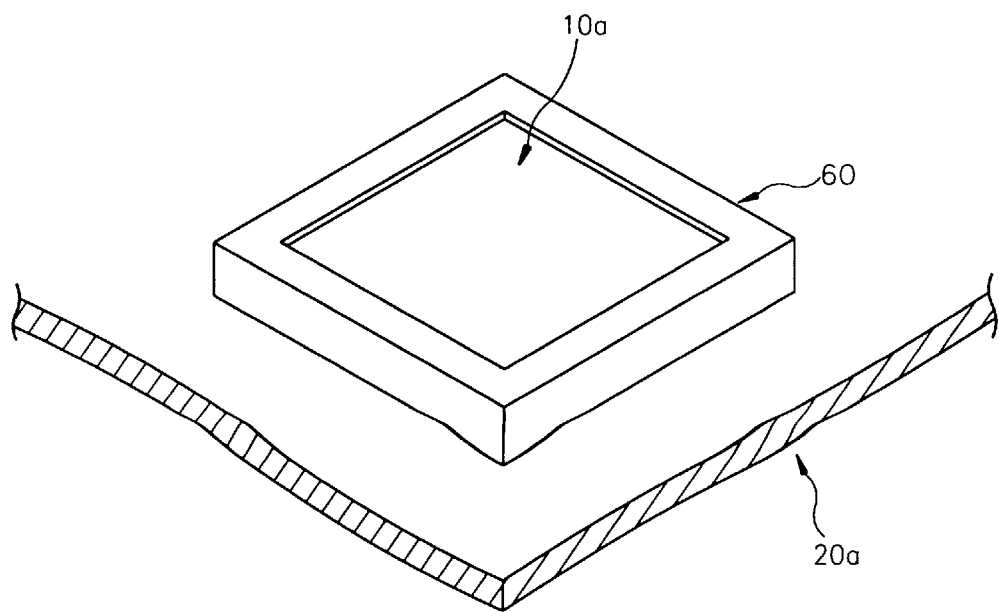
FIG. 7 is a perspective view of the integrated circuit board shown in FIG. 6 wherein the integrated circuit package is completely mounted on the printed circuit board.
Figure 6:
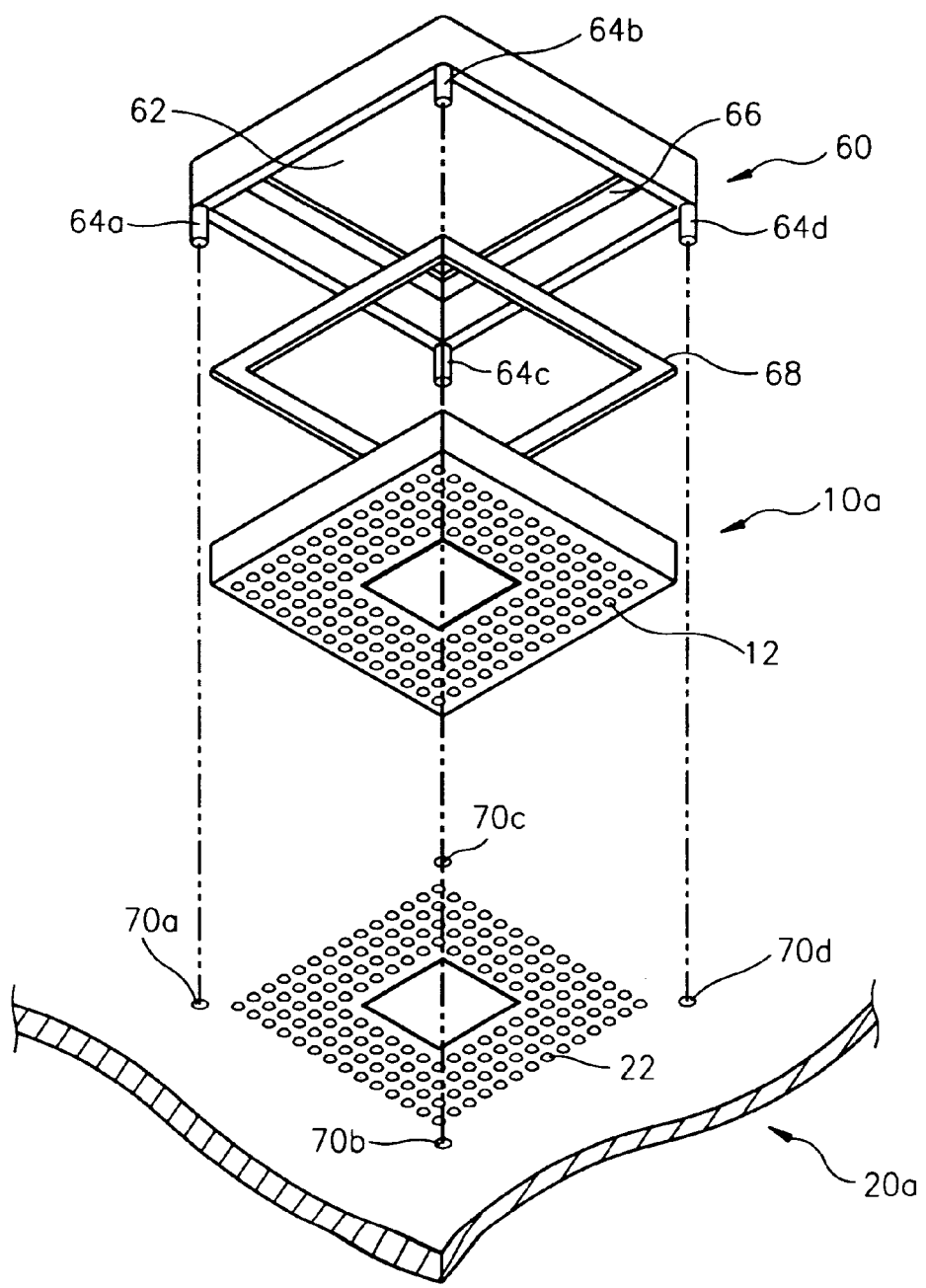
FIG. 6 is an exploded perspective view of an integrated circuit board, integrated circuit package, and housing module as constructed according to the principles of the second embodiment of the present invention.

An exploded perspective view of a circuit board as constructed according to a second embodiment of the present invention is shown in FIG. 6. FIG. 7 shows the integrated circuit package of FIG. 6 completely mounted on printed circuit board 20a. Housing module 60 encloses integrated circuit package 10a within its body. Guide pins 64a through 64d Housing module 60 also allows integrated circuit package 10a to be exactly positioned and mounted on the printed circuit board 20a. In the second embodiment it is the housing module rather than the integrated circuit package that has the guide pins. Printed circuit board 20a has four holes 70a, 70b, 70c and 70d that receive guide pins 64a through 64d to force housing module 60 be exactly mounted on printed circuit board 20a.

When the housing module 60 housing the integrated circuit package 10a is completely positioned and mounted on the printed circuit board 20a, a number of leads 12 on the bottom surface of the integrated circuit package 10a are electrically connected with a number of pads 22 on the upper surface of the printed circuit board 20a, respectively. Also, the guide pins 64a~64d are fitted in the holes 70a~70d, respectively. This leads the integrated circuit package 10a to be exactly mounted on the printed circuit board 20a.

Turning to FIG. 6, the housing module 60 also has an opening 62. When the integrated circuit package 10a is located inside the housing module 60, an integrated circuit chip (not shown) on the integrated circuit package 10a is positioned via the opening 62. Additionally, an adhesive plate 68 may be positioned between housing module 60 and integrated circuit package 10a to securely mount integrated circuit package 10a inside housing module 60.

Figure 8:
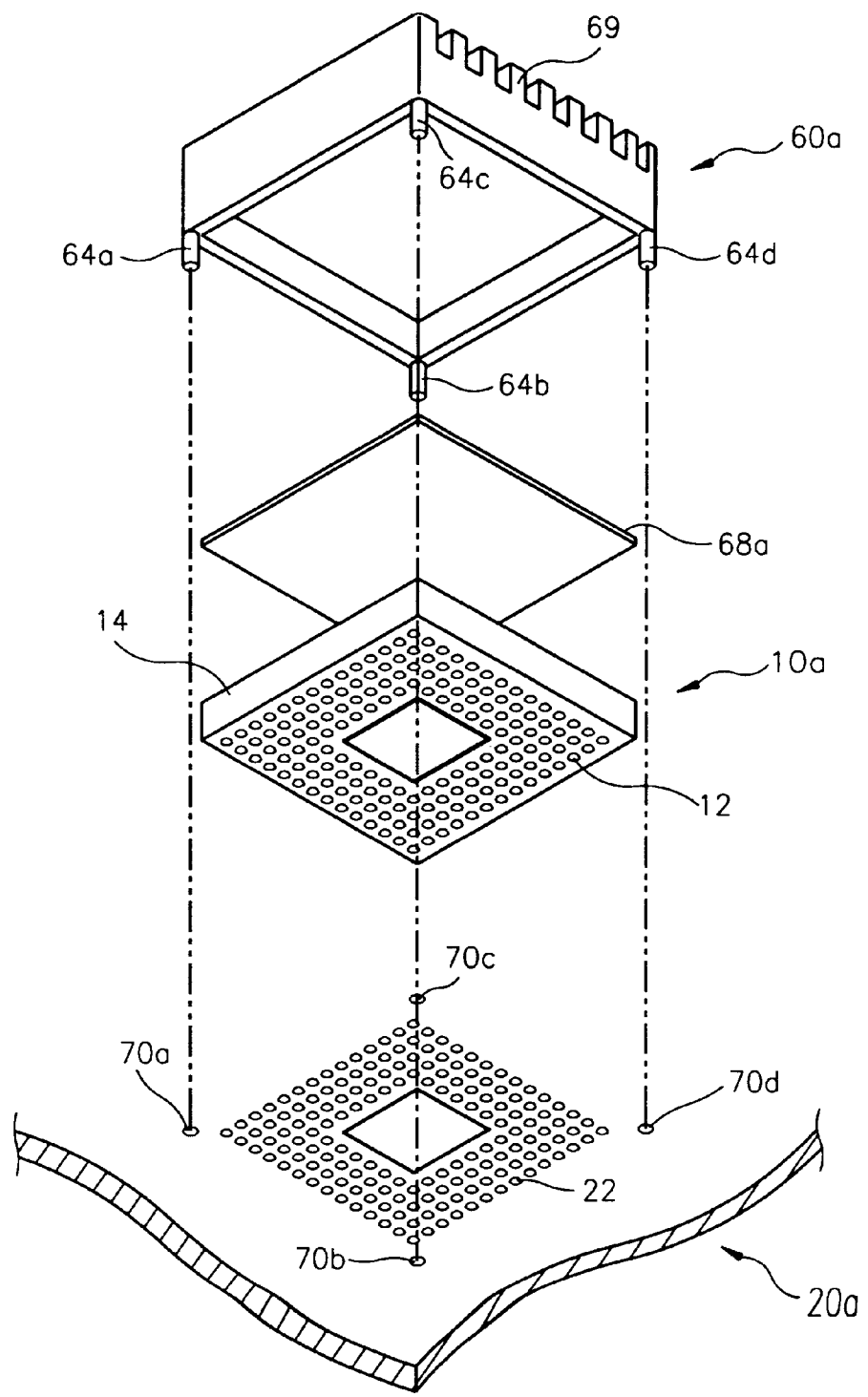
FIG. 8 is an exploded perspective view of an integrated circuit board with a heat radiating housing module as constructed according to a third embodiment of the present invention.
Figure 9:
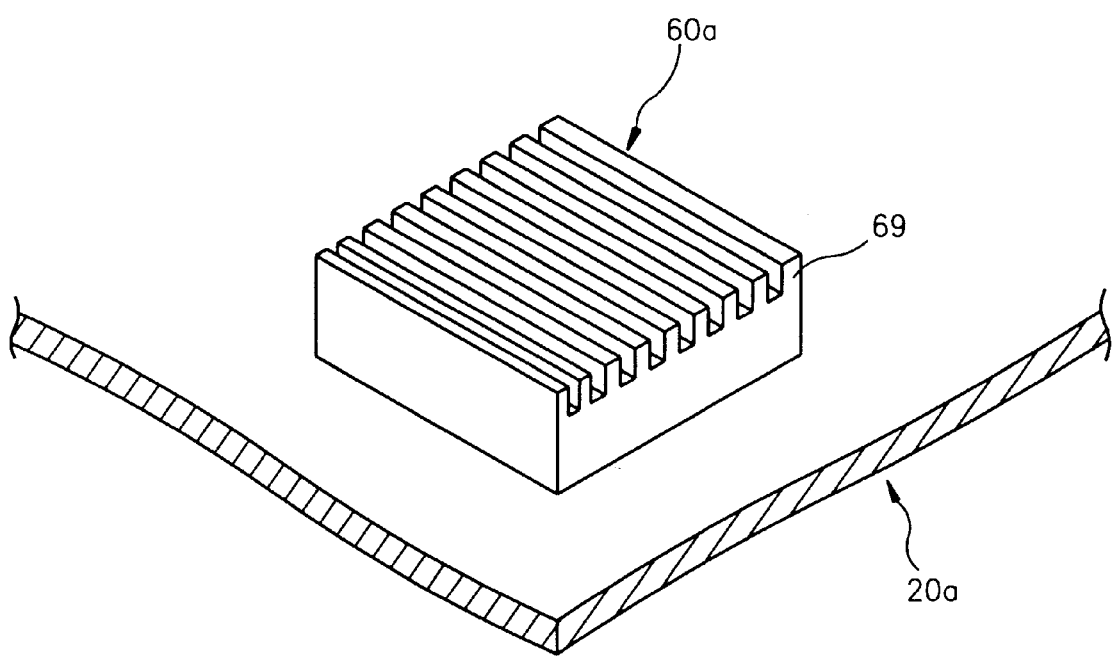
FIG. 9 is a perspective view of the integrated circuit board of FIG. 8 wherein a housing module containing an integrated circuit package is completely mounted on a printed circuit board.

A third embodiment of the present invention is shown in FIGS. 8 and 9. This embodiment uses similar construction to that used in the second embodiment shown in FIG. 6, except for the addition of a heat sink that is positioned on the housing module. Housing module 60a has guide pins 64a through 64d that are used to precisely position the housing module on circuit board 20a. Integrated circuit package 10a is recessed inside of the housing module and can be secured inside the module by using adhesive plate 68a. Housing module 60a has a number of heat radiating pins 69 on an upper surface that form a heat sink to radiate heat that is generated by the integrated circuit package.

Figure 10A:
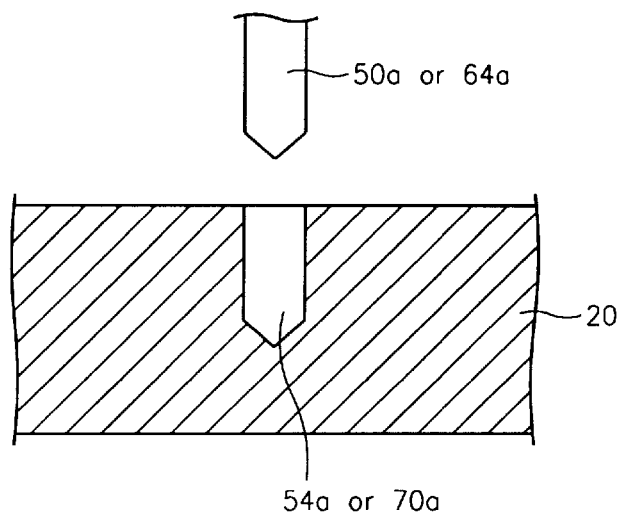
FIGS. 10A and 10B are views illustrating the shapes of guide pins that are located at the bottom of either the integrated circuit package or the bottom of the housing module.
Figure 10B:
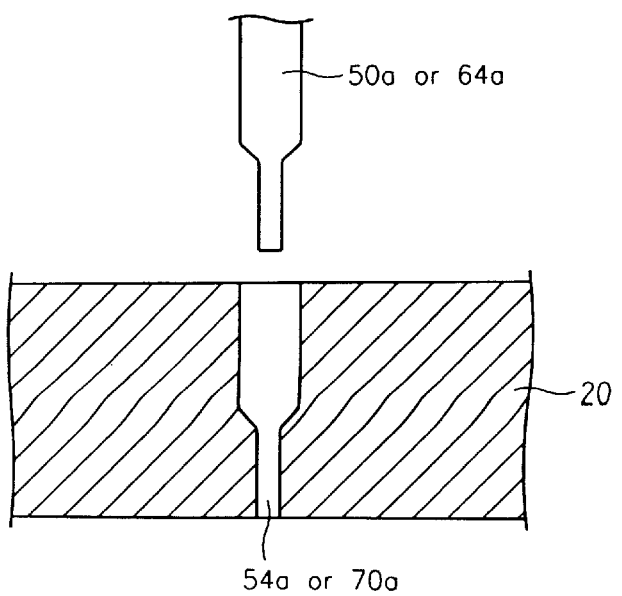

The integrated circuit packages used in the embodiments described above may be of ball grid array (BGA) type or pin grid array (PGA) type. Each of guide pins 50a through 50d or 64a through 64d may have a tapered end, as shown in FIG. 10a or FIG. 10b. Each of holes 54a through 54d or 70a through 70d has a shape that is suitable for receiving the tapered guide pin.

The present invention allows the leads on the bottom surface of an integrated circuit package to be precisely connected with a number of pads or pin holes on a printed circuit board. Additionally, the present invention simplifies determining whether an integrated package is correctly mounted on a circuit board. Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A circuit board, comprising:
   an integrated circuit package having at least two guide pins attached on a bottom surface and being mountable on said circuit board, said circuit board being a ball grid array type of circuit board;
   at least two apertures in said circuit board tailored to snugly fit around said at least two guide pins;
   a plurality of electrical leads on said bottom surface of said integrated circuit package that are electrically connected to said circuit board when said at least two guide pins of said integrated circuit package are engaged with said at least two apertures; and
   said at least two guide pins of said integrated circuit package being any one of a different size and different shape from the standard pins used by said circuit board to simplify determining if said integrated circuit package is precisely positioned on said circuit board.

2. The circuit board of claim 1, further comprising said electrical leads on said bottom surface of said integrated circuit package being electrically connected to a plurality of pads on said circuit board when said at least two guide pins are engaged with said at least two apertures.

3. The circuit board of claim 1, further comprising said electrical leads on said bottom surface of said integrated circuit package being electrically connected to a plurality of lead receiving apertures on said circuit board when said at least two guide pins are engaged with said at least two apertures.

4. The circuit board of claim 1, further comprised of said circuit board being a pin grid array type of circuit board.

5. The circuit board of claim 1, further comprised of said at least two guide pins having a tapered end and a V-shaped conical tip.

6. The circuit board of claim 1, further comprised of said at least two guide pins having a counterbore shape and forming a circumferential seating surface between the two portions of differing diameters of said at least two guide pins.

7. A circuit board, comprising:
   an integrated circuit package mountable on said circuit board;
   a housing module capable of covering said integrated circuit package, said housing module having at least two guide pins attached to a bottom surface of said housing module, said housing module encircling said integrated circuit package along a perimeter around all sides of said integrated circuit package perpendicular to the plane of said circuit board;
   at least two apertures in said circuit board tailored to snugly fit around said at least two guide pins of said housing module;
   a plurality of electrical leads on said bottom surface of said integrated circuit package that are electrically connected to said circuit board when said at least two guide pins of said housing module are engaged with said at least two apertures;
   said at least two guide pins of said housing module being any one of a different size and different shape from the standard pins used with said circuit board to simplify determining if said integrated circuit package is precisely positioned on said circuit board; and
   an adhesive plate attached to an inner surface of said housing module to securely mount said integrated circuit package inside of said housing module.

8. The circuit board of claim 7, further comprising said housing module having an aperture on a top surface of said housing module.

9. The circuit board of claim 7, further comprised of said housing module being constructed with a heat radiating material.

10. The circuit board of claim 7, further comprising a plurality of heat radiating pins positioned on an upper surface of said housing module.

11. The circuit board of claim 8, with each of said at least two guide pins having a tapered end.

12. The circuit board of claim 7, further comprising said electrical leads on said bottom surface of said integrated circuit package being electrically connected to a plurality of pads on said circuit board when said at least two guide pins are engaged with said at least two apertures.

13. The circuit board of claim 7, further comprising said electrical leads on said bottom surface of said integrated circuit package being electrically connected to a plurality of lead receiving apertures on said circuit board when said at least two guide pins are engaged with said at least two apertures.

14. The circuit board of claim 7, further comprised of said circuit board being a ball grid array type of circuit board.

15. The circuit board of claim 7, further comprised of said circuit board being a pin grid array type of circuit board.

16. The circuit board of claim 7, further comprised of said at least two guide pins having a tapered end and a V-shaped conical tip.

17. The circuit board of claim 7, further comprised of said at least two guide pins having a counterbore shape and forming a circumferential seating surface between the two portions of differing diameters of said at least two guide pins.

18. A process of precisely mounting an integrated circuit package on a circuit board, comprising the steps of:

inserting an integrated circuit package into a housing module having at least two guide pins attached on a lower surface, said housing module encircling said integrated circuit package along a perimeter around all sides of said integrated circuit package perpendicular to the plane of said circuit board;

positioning said housing module and said integrated circuit package over said circuit board to align said at least two guide pins with at least two apertures that are tailored to receive said at least two pins; and precisely placing said integrated circuit package on said circuit board by engaging said at least two guide pins with said at least two apertures.

\* \* \* \* \*